United States Patent [19]

Hemmerich et al.

[11] Patent Number: 5,068,546
[45] Date of Patent: Nov. 26, 1991

[54] SOLID STATE LASER OPERATING WITH FREQUENCY DOUBLING AND STABILIZED BY AN EXTERNAL RESONATOR

[75] Inventors: Andreas Hemmerich, Munich, Fed. Rep. of Germany; David McIntyre, Corvallis, Oreg.; Claus Zimmermann; Theodor Haensch, both of Munich, Fed. Rep. of Germany

[73] Assignee: Max-Planck-Gesellschaft zur Foerderung der Wissenschaften e.V., Fed. Rep. of Germany

[21] Appl. No.: 573,536

[22] Filed: Aug. 27, 1990

[30] Foreign Application Priority Data

Mar. 15, 1990 [DE] Fed. Rep. of Germany ....... 4008349

[51] Int. Cl.$^5$ ............................................... H01S 3/10
[52] U.S. Cl. ...................................... 359/328; 372/22; 372/75; 372/94
[58] Field of Search .................... 372/21, 22, 75, 94; 307/425, 427

[56] References Cited

U.S. PATENT DOCUMENTS 4,194,168  3/1980  Jarrett et al. ............................ 372/94
4,879,722 11/1989  Dixon et al. ........................... 307/427
4,884,276 11/1989  Dixon et al. ........................... 372/21

OTHER PUBLICATIONS

Dixon et al., "432nm Source Based on Efficient Second-Harmonic Generation of GaAlAs Diode Laser Radiation in a Self-Locking External Resonant Cavity", Optics Letters, Jul. 15, 1989, vol. 14, No. 14, pp. 731-733.

Primary Examiner—William L. Sikes
Assistant Examiner—Susan S. Morse
Attorney, Agent, or Firm—Nields & Lemack

[57] ABSTRACT

Solid state laser comprising a solid state laser diode for generating fundamental wave laser radiation; an external ring resonator which is arranged in the beam path of the fundamental wave laser radiation and through which the fundamental wave laser radiation passes in a predetermined forward direction; an optical nonlinear medium arranged in the ring resonator for generating the 2nd harmonic of the fundamental wave laser radiation; and an arrangement for feeding fundamental wave laser radiation back to the solid state laser diode which includes a scattering optical element which is arranged in the beam path of the fundamental wave laser radiation of the ring resonator and which causes a small part of the fundamental wave laser radiation to propagate in a direction opposite to the forward direction through the beam path back to the solid state laser diode.

16 Claims, 1 Drawing Sheet

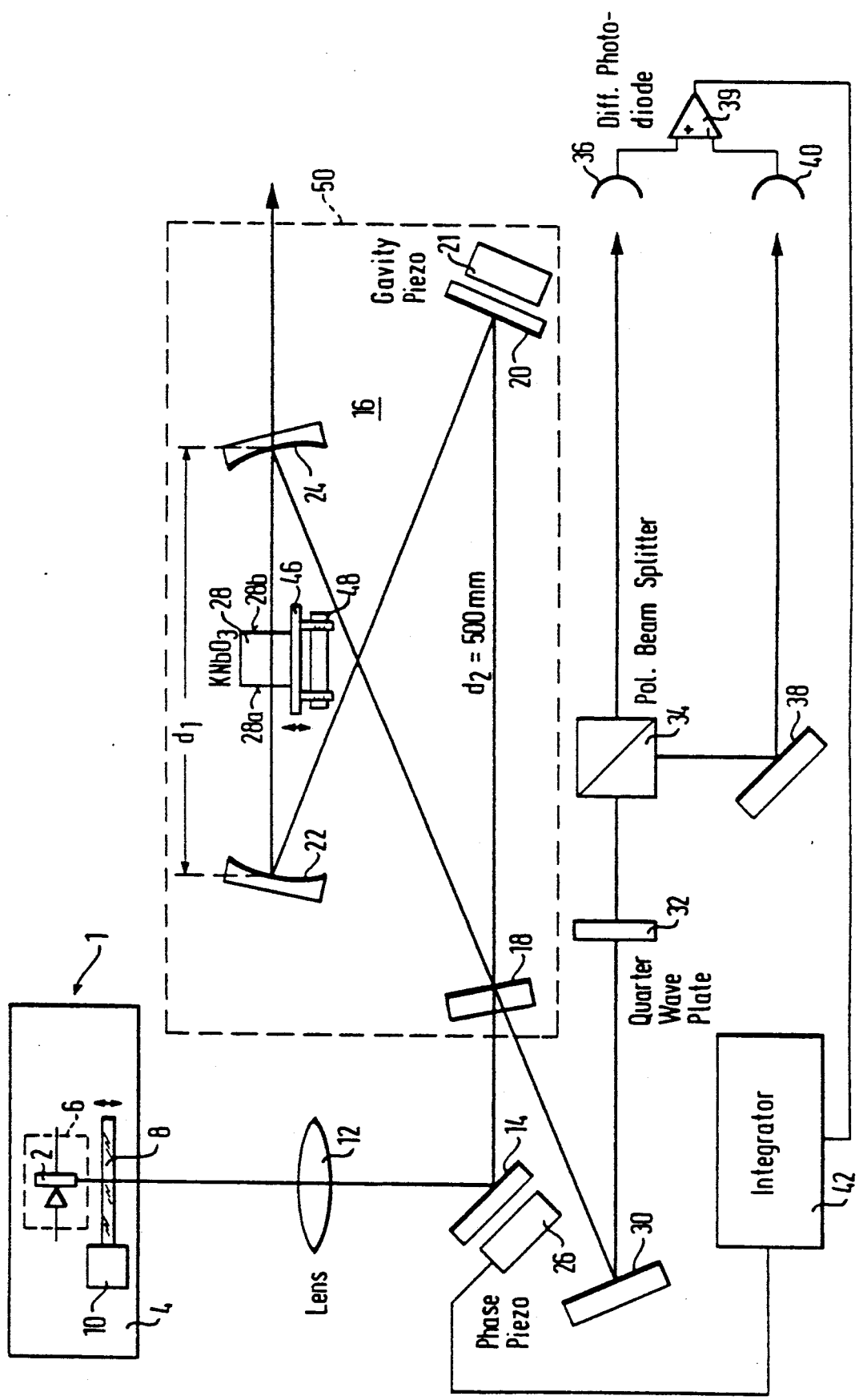

SOLID STATE LASER OPERATING WITH FREQUENCY DOUBLING AND STABILIZED BY AN EXTERNAL RESONATOR

FIELD OF THE INVENTION

The present invention relates to a solid state laser.

DESCRIPTION OF THE RELATED ART

In a publication of Dixon et al., OPTICS LETTERS, July 15, 1989, volume 14, number 14, p. 731–733, a solid state laser is described in detail which has a GaAlAs laser diode of which the fundamental wave radiation passes in succession through a collimator lens, a magneto-optical isolator having a polarizing output beam splitter, a further lens, an external resonator which is formed by two concave mirrors and in which a potassium niobate frequency-doubling crystal is disposed, and a dichroitic mirror arranged inclined to the beam path of the radiation emerging from the resonator and allowing the frequency-doubled radiation to pass but reflecting part of the fundamental wave radiation into a feedback beam path. The feedback beam path contains a half-wavelength plate and a mirror by which the fedback radiation is directed into the output beam splitter and by the latter reflected back into the laser diode. The fedback fundamental wave radiation, the intensity of which can be adjusted by turning the half-wavelength plate, stabilizes the fundamental wave radiation of the laser diode to the resonance frequency of the external resonator and narrows the bandwidth thereof. This publication also mentions incidentally that instead of the linear resonator a unidirectional ring resonator may also be employed which has a different simpler feedback arrangement. However, no details are given thereon.

Stabilizing the wavelength of a solid state laser by feedback of radiation from an external optical resonator is also known from a publication by Dahmani et al, OPTICS LETTERS, volume 12, number 11, November 1987, p. 376–378.

SUMMARY OF THE INVENTION

The present invention is based on the problem of providing a solid state laser of the type set forth at the beginning which has a particularly simple and effective feedback means.

The invention is embodied in a solid state laser comprising a solid state laser diode for generating fundamental wave laser radiation, an external ring resonator which is arranged in the beam path of the fundamental wave laser radiation and through which the fundamental wave laser radiation passes in a predetermined forward direction, an optical nonlinear medium arranged in the ring resonator for generating the 2nd harmonic of the fundamental wave laser radiation and an arrangement for feeding fundamental wave laser radiation back to the solid state laser diode.

According to the invention, the feedback arrangement comprises an optical means which is arranged in the beam path of the fundamental wave laser radiation of the ring resonator and which causes a small part of the fundamental wave laser radiation to propagate in a direction opposite to the forward direction through the beam path back to the solid state laser diode.

Since in the solid state laser diode according to the invention for the feedback fundamental wave radiation is used which propagates in the rearward direction through at least a part of the ring resonator containing the frequency-doubling optical element and through the entrance beam path of the fundamental wave radiation, no additional optical elements are necessary for a separate feedback beam path. The rearwardly propagated fundamental wave radiation is preferably generated by scattering the forwardly propagated fundamental wave radiation. It is particularly advantageous to use as scattering element an interface of the optically nonlinear frequency-doubling crystal traversed by the fundamental wave radiation in the ring resonator. The crystal may be displaceably mounted transversely of the beam path for adjusting the fedback radiation. Even well finished interfaces of optically nonlinear frequency-doubling crystals scatter enough to generate the necessary feedback radiation.

Generation of the rearwardly propagated radiation by scattering has the advantage that firstly a ring resonator of high quality can be used which by resonance enhancement ensures the high intensity of the forwardly propagated fundamental wave radiation necessary for an effective frequency doubling and at the same time the rearwardly propagated radiation with the necessary low intensity is generated with simple means.

The frequency of the present solid state laser can be varied in relatively wide ranges by adjustment of the resonant frequency of the ring resonator in combination with influencing of the fundamental wave frequency of the laser diode.

BRIEF DESCRIPTION OF THE DRAWING

The invention will be explained hereinafter with reference to the drawing, the single Figure of which shows a schematic illustration of a preferred example of embodiment of a solid state laser according to the invention.

DESCRIPTION OF THE PREFERRED EMBODIMENT

The solid state laser illustrated in the drawing includes a diode laser unit 1 having a GaAlAs laser diode 2 (Spectra Physics SDL 5410-C) which is accommodated in a small evacuated chamber 4 and is provided with a thermostating means 6 which is illustrated only schematically and permits the temperature of the laser diode to be adjusted to values above and below 0° C. for adjusting the fundamental wavelength. For a fundamental wavelength of 840.6 nm the operating temperature of the laser diode is −36° C. The fundamental wave laser radiation emitted by the laser diode passes through a beam path which includes a thin (for example about 150 $\mu$m thick) glass plate 8 which is mounted a small distance (for example 50 $\mu$m) from the laser diode and which is attached to a piezoelectric adjusting means 10, a focusing optical system 12 represented as lens, a deflection mirror 14 and a ring resonator 16 which comprises a planar first mirror 18, a planar second mirror 20, a concave third mirror 22 and a concave fourth mirror 24. In the centre between the concave mirrors 22, 24 an optically nonlinear medium in the form of a $KNbO_3$ crystal 28 is arranged. The optical length of the ring resonator is variable by a piezoelectric adjusting means 21 associated with the mirror 20. The crystal is provided with a thermostating means 46, in particular cooling means, and mounted on an adjusting means 48, which can include a micrometer screw, so that it can be displaced transversely of the beam path. The ring resonator with the mirrors 18, 20, 22, 24 and the frequency-doubling crystal is arranged in a vacuum chamber 50 to avoid disturbances by condensed moisture on cooling of the crystal.

The glass plate 8 effects a weak feedback of the fundamental wave radiation into the laser and thereby modifies the effective reflectivity of the radiation output face of the laser diode. The distance of the glass plate 8 from the output face of the laser diode is adjustable to permit the selection of different longitudinal modes of the laser, this being important when a specific wavelength is required.

The mirror 14 is adjustable by a piezoelectric adjusting means 26 forming part of an automatic phase control which will be discussed below.

The optical system 12 focuses the laser radiation into a beam waist in the centre between the mirrors 18 and 20. The mirror 18 has a reflectivity of 98% and a transmission of about 2% and the mirrors 20, 22 and 24 each have a reflectivity of 99.5%. The concave mirrors 22, 24 each have a radius of curvature of 50 mm and a distance apart of $d_1 = 56$ mm. The optical path connecting the two curved mirrors 22 and 24 via the two planar mirrors 18, 20 has a length $d_2 = 500$ mm. This construction ensures a small beam waist between the two concave mirrors which is adjustable by changing $d_1$. The maximum waist size is governed by the distance $d_2$. In the small waist in the centre between the mirrors 22 and 24 the 5 mm long potassium niobate crystal 28 is arranged and serves for the frequency doubling, i.e. generating the first harmonic. The crystal 28 is defined by a front face 28a and a rear face 28b and orientated so that the fundamental wave radiation propagated in the ring resonator in the forward direction from the mirror 18 via the mirrors 20 and 22 is not reflected directly by the face 28a back into the beam path of the forward radiation. The front and the rear end faces of the crystal are moreover provided with reflection-reducing layers dimensioned for 850 nm. For phase matching the crystal 28 is cooled to $-28.3°$ C. for the fundamental wavelength of 840.6 nm.

The fundamental wave radiation transmitted by the mirror 18 is reflected by a mirror 30 and passes through a quarter-wavelength plate or slice 32 into a polarizing beam splitter 34 which generates two subbeams with polarization directions perpendicular to each other, one of which is incident directly on a first photodiode 36 and the other of which is incident on a second photodiode 40 via a deflection mirror 38. The photodiodes are coupled to a differential amplifier 39 or in difference connection to generate an error signal when the intensities of the two polarization directions are different. The error signal is supplied to an integrator 42 of which the output signal controls the adjusting means 26 in known manner (Hänsch et al., Opt. Commun. 35, 441 (1980)).

In the present laser the laser diode 2 is stabilized by fedback fundamental wave radiation which arises by scattering of the radiation propagated in the ring resonator in the forward direction at imperfections of optical components, in particular crystal faces, specifically the entrance-side face 28a of the frequency-doubling crystal 28, and runs along the same beam path as the forwardly running fundamental wave radiation but in the opposite direction via the mirrors 22, 20, 18 and 14 back to the laser diode 2. The crystal 28 is mounted displaceably transversely of the beam path to enable the intensity of the fedback radiation to be adjusted.

For the feedback only a small power of the order of magnitude of $10^{-4}$ of the diode output power is necessary. The forwardly propagated mode and the rearwardly propagated mode have the same resonance frequency and this is important for the present laser because the resonance of the rearwardly running mode governs the stabilization of the frequency of the laser diode whilst the forwardly running mode must be in resonance to ensure a high frequency-doubling effectiveness. The optical synchronization of the laser diode depends very much on the phase of the rearwardly running radiation and thus on the optical path length from the diode to the ring resonator and on the length of the beam path in the ring resonator, which is adjustable by adjusting the mirror 20 using the adjusting means 21. The optical path length between the laser diode 2 and the ring resonator 16 is controlled by the phase mirror 14 in such a manner that the laser frequency coincides with the maximum of the ring resonator resonance. Due to this phase control and synchronous variation of the resonator length and the diode current the laser frequency can be tuned over a range of 4 Gigahertz.

The cooling means 6 and 46 may each include a solid aluminium block on which the element to be cooled or heated is mounted and which contains passages for a heat-carrier fluid. The passages are connected to a conventional thermostat which holds the fluid at a predetermined temperature and allows it to circulate through the passages.

The parameters and values mentioned above in conjunction with the embodiment of the invention described are only preferred examples and are not meant to be restrictive.

What is claimed is:

1. A solid state laser comprising
    a solid state laser diode for generating fundamental wave laser radiation,
    an external ring resonator which is arranged in the beam path of the fundamental wave laser radiation and through which the fundamental wave laser radiation passes in a predetermined forward direction,
    an optical nonlinear medium arranged in the ring resonator for generating the 2nd harmonic of the fundamental wave laser radiation and
    means for feeding fundamental wave laser radiation back to the solid state laser diode,
    said means comprising optical means causing a small part of the fundamental wave laser radiation to propagate in a direction opposite to the forward direction through at least a part of the beam path of said ring resonator back to the solid state laser diode.

2. The solid state laser as claimed in claim 1, characterized in that the optical means (28e) is a scattering optical element.

3. The solid state laser as claimed in claim 2, characterized in that the scattering optical element is a surface of a frequency-doubling crystal forming the nonlinear optical medium.

4. The solid state laser as claimed in claim 3, characterized in that the frequency-doubling crystal is mounted displaceably transversely of the beam path.

5. The solid state laser as claimed in claim 1, characterized by means for phase adjustment of the fundamental wave radiation positioned in the beam path between said laser diode and said ring resonator.

6. The solid state laser as claimed in claim 1, characterized in that the ring resonator includes a partially transmissive planar entrance mirror, an adjustably mounted second planar mirror and two concave mirrors between which the nonlinear optical medium is arranged.

7. The solid state laser as claimed to claim 6, characterized in that the beam path crosses itself between the planar mirrors and the concave mirrors.

8. The solid state laser as claimed in claim 6, characterized in that the first planar mirror is partially transmissive and couples the radiation from the laser diode into the ring resonator and that the second planar mirror is adjustably mounted.

9. The solid state laser according to claim 1, characterized in that the laser diode is provided with a thermostatic means.

10. The solid state laser according to claim 1, characterized in that the nonlinear medium is provided with a thermostatic means.

11. A solid state laser comprising a solid state laser diode for generating fundamental wave laser radiation, an external ring resonator which is arranged in the beam path of the fundamental wave laser radiation and through which the fundamental wave laser radiation passes in a predetermined forward direction, an optical nonlinear medium arranged in the ring resonator for generating the second harmonic of the fundamental wave laser radiation and means for feeding fundamental wave laser radiation back to the solid state laser diode said means comprising an optical element positioned in said ring resonator and adapted to case a small part of the fundamental wave laser radiation to propagate in a direction opposite to the forward direction through at least a part of the beam path of the ring resonator back to the solid state laser diode.

12. A solid state laser comprising a solid state laser diode for generating fundamental wave laser radiation, an external ring resonator which is arranged in the beam path of the fundamental wave laser radiation and through which the fundamental wave laser radiation passes in a predetermined forward direction, an optical nonlinear medium arranged in the ring resonator for generating the second harmonic of the fundamental wave laser radiation and means for feeding fundamental wave laser radiation back to the solid state laser diode said means comprising a scattering optical element arranged in the beam path of the fundamental wave laser radiation and causing a small part of the fundamental wave laser radiation to propagate in a direction opposite to the forward direction through at least a part of the beam path of the ring resonator back to the solid state laser diode.

13. The solid state laser as claimed in claim 12, characterized in that the scattering optical element is a surface of a frequency-doubling crystal forming the nonlinear optical medium.

14. The solid state laser as claimed in claim 13, characterized in that the frequency-doubling crystal is mounted displaceably transversely of the beam path.

15. The solid state laser as claimed in claim 11, characterized in that said optical element is a scattering optical element positioned in the beam path of said ring resonator.

16. The solid state laser as claimed in claim 15, wherein said scattering optical element is a surface of a frequency-doubling crystal forming the non-linear optical medium.

* * * * *